(12) United States Patent
Kato et al.

(10) Patent No.: US 8,294,221 B2
(45) Date of Patent: Oct. 23, 2012

(54) SEMICONDUCTOR MEMORY DEVICE (75) Inventors: Yoshiko Kato, Kanagawa-ken (JP); Hiroyuki Kutsukake, Kanagawa-ken (JP); Masayuki Ichige, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 12/952,637

(22) Filed: Nov. 23, 2010

(65) Prior Publication Data
US 2012/0007192 A1    Jan. 12, 2012

(30) Foreign Application Priority Data

Jul. 8, 2010  (JP) .................................. 2010-155757

(51) Int. Cl.
*H01L 21/70*    (2006.01)
(52) U.S. Cl. .................. 257/390; 257/401; 257/E27.081
(58) Field of Classification Search .................. 257/390, 257/401, E27.081
See application file for complete search history.

(56) References Cited

U.S. PATENT DOCUMENTS

| | | | |
|---|---|---|---|
| 5,715,189 A * | 2/1998 | Asakura ........................ 365/72 |
| 6,522,004 B1 * | 2/2003 | Higuchi ........................ 257/758 |
| 6,936,885 B2 * | 8/2005 | Shin et al. ..................... 257/315 |
| 2006/0113581 A1 * | 6/2006 | Miki et al. ..................... 257/306 |

FOREIGN PATENT DOCUMENTS

| JP | 2002-353346 | 12/2002 |
|---|---|---|
| JP | 2006-186342 | 7/2006 |

* cited by examiner

*Primary Examiner* — Trung Q Dang
(74) *Attorney, Agent, or Firm* — Oblon, Spivak, McClelland, Maier & Neustadt, L.L.P.

(57) ABSTRACT

According to one embodiment, a semiconductor memory device includes a plurality of memory cell blocks, a plurality of first wirings, a plurality of second wirings, and a contact. Each of the memory cell blocks includes a plurality of memory cell units. Each of the plurality of memory cell units includes a plurality of memory cells and is provided in a first direction at a prescribed spacing. The plurality of memory cell blocks is arranged in a second direction intersecting with the first direction. The plurality of first wirings extends in the second direction and is provided in the first direction at a prescribed spacing. The plurality of second wirings is provided at least one of above and below the first wiring. The contact is provided at both end portions of the second wiring in the second direction and connects the first wiring to the second wiring. A width dimension of the second wiring along the first direction is larger than a width dimension of the first wiring along the first direction.

18 Claims, 10 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2010-155757, filed on Jul. 8, 2010; the entire contents of which are incorporated herein by reference.

FIELD

Embodiments described herein relate generally to a semiconductor memory device.

BACKGROUND

Recently, with the increase of packaging density and integration level in semiconductor memory devices, the bit line connected to the memory cell is made thinner and longer. Thus, the wiring resistance tends to increase.

In this context, techniques for backing the bit line with a low resistance metal line have been proposed.

However, simply backing the bit line with a low resistance metal line may fail to reduce the total wiring resistance of the bit line due to problems such as the thin line effect.

DETAILED DESCRIPTION

In general, according to one embodiment, a semiconductor memory device includes a plurality of memory cell blocks, a plurality of first wirings, a plurality of second wirings, and a contact. Each of the memory cell blocks includes a plurality of memory cell units. Each of the plurality of memory cell units includes a plurality of memory cells and is provided in a first direction at a prescribed spacing. The plurality of memory cell blocks is arranged in a second direction intersecting with the first direction. The plurality of first wirings extends in the second direction and is provided in the first direction at a prescribed spacing. The plurality of second wirings is provided at least one of above and below the first wiring. The contact is provided at both end portions of the second wiring in the second direction and connects the first wiring to the second wiring. A width dimension of the second wiring along the first direction is larger than a width dimension of the first wiring along the first direction.

Embodiments will now be illustrated with reference to the drawings. In the drawings, similar components are labeled with like reference numerals, and the detailed description thereof is omitted as appropriate.

As an example, it is assumed that a semiconductor memory device 1 according to the embodiments is a NAND type EEPROM. The term "total wiring resistance of the bit line" indicates the wiring resistance of the bit line, including the backing wiring connected to the bit line. The "total wiring resistance of the bit line" may be simply referred to as "wiring resistance of the bit line".

The arrows X, Y, and Z in the drawings represent three orthogonal directions.

First Embodiment

Figure 1:
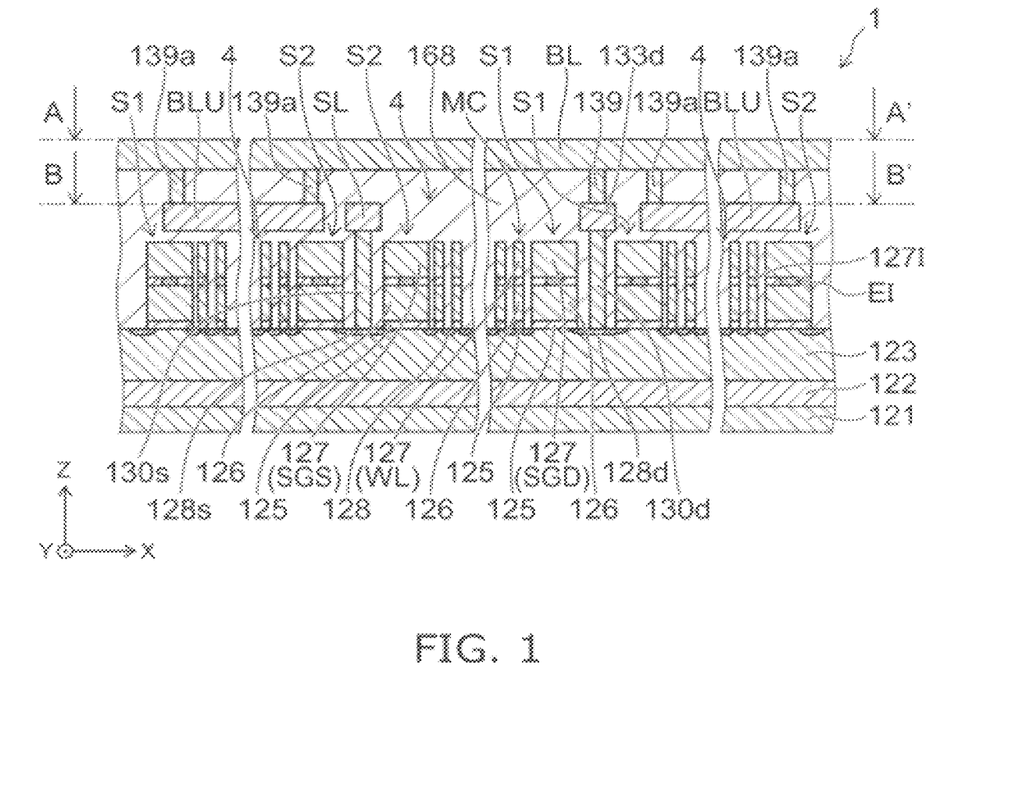
FIG. 1 is a schematic view illustrating a semiconductor memory device according to a first embodiment.

FIG. 1 is a schematic view illustrating a semiconductor memory device according to a first embodiment.

Figure 2:
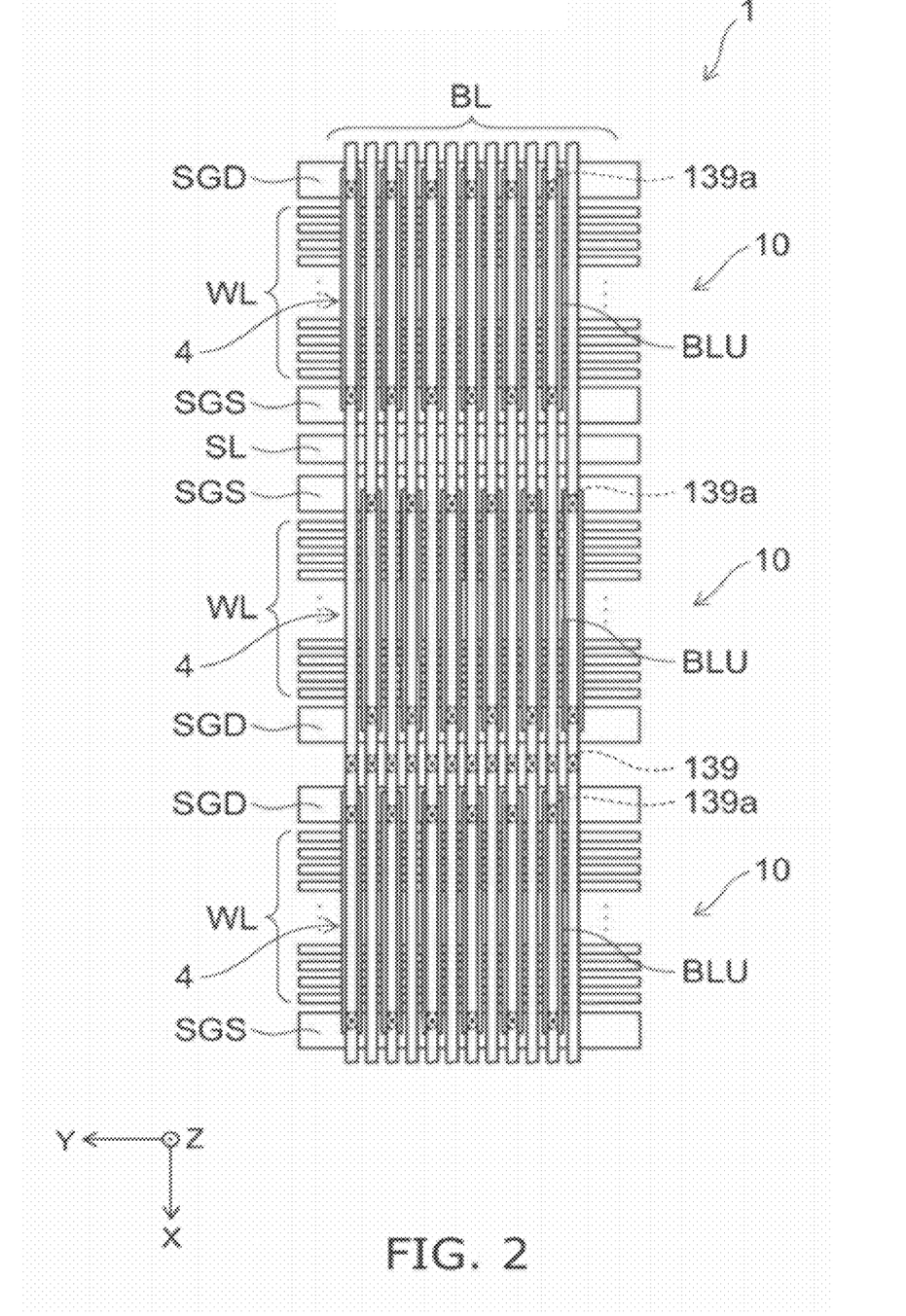
FIG. 2 is a cross-sectional view taken along line A-A' in FIG. 1.

FIG. 2 is a cross-sectional view taken along line A-A' in FIG. 1.

Figure 3:
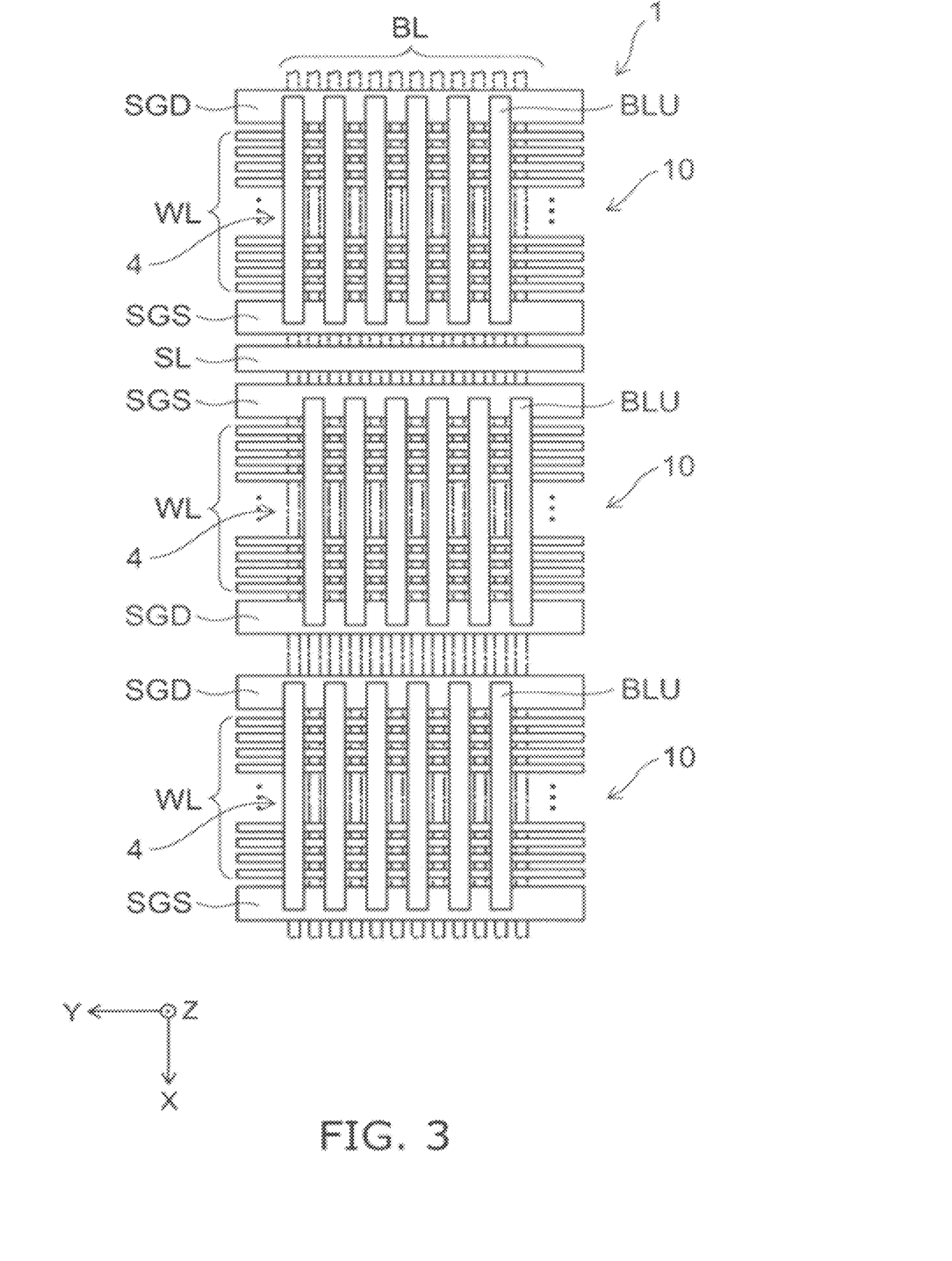
FIG. 3 is a cross-sectional view taken along line B-B' in FIG. 1.

FIG. 3 is a cross-sectional view taken along line B-B' in FIG. 1.

As shown in FIGS. 1 to 3, the semiconductor memory device 1 includes a plurality of memory cell blocks 10. Each memory cell block 10 includes a plurality of memory cell units 4 each including a plurality of memory cells MC and provided along the Y direction (first direction), and a plurality of bit lines BL (first wirings) extending in the X direction (second direction) orthogonal to the Y direction and provided along the Y direction.

Here, the number of memory cells MC is b (b is an integer of two or more). For instance, the number b of memory cells MC can be 16, 32, 34, 66, 68, 130, or 132.

The memory cell MC is a nonvolatile memory cell. In the X direction, a plurality of memory cells MC are connected in series. One end of the plurality of memory cells MC is connected to a bit line BL through a select transistor (first select transistor) S1. The other end of the plurality of memory cells MC is connected to a source line SL through a select transistor (second select transistor) S2.

Here, it is defined that the plurality of memory cells MC interposed between the first select transistor S1 and the second select transistor S2 and connected in series constitutes a memory cell unit 4. Each memory cell unit 4 is located immediately below the bit line BL. The dimension of the memory cell unit 4 in the Y direction is nearly equal to the dimension of the bit line BL in the Y direction. In other words, the pitch dimension of the memory cell unit 4 in the Y direction is nearly equal to the pitch dimension of the bit line BL in the Y direction. Here, the "pitch dimension" refers to the dimension of the repeating unit of the layout. For instance, the pitch dimension of the bit line BL is the dimension obtained by adding the dimensional width of the bit line BL in the Y direction and the spacing between the adjacent bit lines BL.

The source line SL extends in the Y direction and is provided below the bit lines BL.

A plurality of blocks 10 are arranged in the X direction. The blocks 10 is provided between the source line SL or the bit line BL connected to a contact 139.

The transistors of the plurality of memory cells MC are formed on the same well.

Control gates 127 of the select transistors S1 are commonly connected in the Y direction to constitute a block select line SGD. And one memory cell unit 4 can be selected one of the blocks 10 including the plurality of memory cell units 4 and the plurality of memory cell units 4 included selected the blocks are connected to the bit line BL.

Control gates 127 of the select transistors S2 are commonly connected in the Y direction to constitute a block select line SGS.

Control gates 127 of the memory cells MC are commonly connected in the Y direction to constitute a word line WL.

That is, the memory cell unit 4 is a NAND type memory cell unit.

Next, the configuration of the memory cell MC is illustrated.

As shown in FIG. 1, a floating gate 126 is provided on a p-type silicon region 123 via a tunnel gate insulating film 125. On the floating gate 126, a control gate 127 is provided via an intergate insulating film 127I.

Next, the configuration of the select gate transistors S1 and S2 is illustrated.

As shown in FIG. 1, a floating gate 126 is provided on a p-type silicon region 123 via a tunnel gate insulating film 125. On the floating gate 126, a control gate 127 is provided via an intergate insulating film 127I. Here, an opening EI is formed in the intergate insulating film 127I. The control gate 127 and the floating gate 126 are electrically connected through the opening EI.

The thickness of the tunnel gate insulating film 125 is e.g. 1 to 20 nm (nanometers). The material of the floating gate 126 can be e.g. polysilicon. The thickness of the floating gate 126 can be e.g. 10 to 500 nm.

The material of the intergate insulating film 127I can be e.g. a stacked film of silicon oxide film/silicon nitride film/ silicon oxide film, a stacked film of silicon nitride film/silicon oxide film/silicon nitride film/silicon oxide film/silicon nitride film, a stacked film of silicon oxide film/AlOx film/ silicon oxide film, a stacked film of silicon oxide film/HfA-lOx film/silicon oxide film, a stacked film of silicon oxide film/HfOx film/silicon oxide film, or a silicon oxide film. The thickness of the intergate insulating film 127I can be e.g. 2 to 30 nm.

The material of the control gate 127 can be e.g. polysilicon, WSi (tungsten silicide), CoSi (cobalt silicide), NiSi (nickel silicide), or a stacked film of tungsten and polysilicon. The thickness of the control gate 127 can be e.g. 10 to 500 nm.

Next, the configuration of the memory cell unit 4 is illustrated.

As shown in FIG. 1, an n-type silicon region 122 is provided on a p-type silicon substrate 121. A p-type silicon region 123 is provided on the n-type silicon region 122. The p-type silicon region 123 is divided in the Y direction into a plurality of regions by device isolation insulating films, not shown.

In the p-type silicon region 123, for instance, the boron impurity concentration is set to $10^{14}$ to $10^{19}$ cm$^{-3}$. The tunnel gate insulating film 125 can be made of e.g. one of silicon oxide film, silicon oxynitride film, and silicon nitride film, or a stacked film including them.

Sidewall insulating films, not shown, are provided on both side surfaces of the floating gate 126 and the control gate 127 in the X direction. The sidewall insulating film, not shown, can be made of e.g. silicon nitride film or silicon oxide film. The thickness of the sidewall insulating film can be e.g. 5 to 200 nm.

In the p-type silicon region 123 on both sides of the floating gate 126 in the X direction, n-type diffusion layers 128 serving as source/drain electrodes are provided.

The n-type diffusion layer 128, the floating gate 126, and the control gate 127 constitute a floating gate type nonvolatile EEPROM cell transistor.

In this cell, charge is injected through the tunnel gate insulating film 125 into the floating gate 126. The charge is stored as information of a digital bit. The conductance change of the MOSFET corresponding to the amount of charge is measured to read the information. Thus, the cell serves as a nonvolatile semiconductor memory device. Here, the floating gate 126 may be made of an insulating film such as silicon nitride film.

The gate length of the floating gate 126 (width dimension of the floating gate 126 in the X direction) can be e.g. 0.01 to 0.5 μm (micrometers).

The n-type diffusion layer 128 serving as a source/drain region is doped with e.g. at least one of phosphorus, arsenic, and antimony so that the surface concentration is $10^{17}$ to $10^{21}$ cm$^{-3}$. The depth of the n-type diffusion layer 128 is e.g. 10 to 500 nm.

The n-type diffusion layer 128 is shared by adjacent memory cells MC to realize NAND connection.

One of the n-type diffusion layers 128 is a bit line side diffusion layer 128d. The bit line side diffusion layer 128d is connected to the bit line BL through a contact 130d, an intermediate wiring layer 133d, and the contact 139.

The bit line BL can be formed of e.g. copper, tungsten, tungsten silicide, or aluminum.

The contact 139 is a contact between the bit line BL and the intermediate wiring layer 133d. The contact 130d is a contact between the intermediate wiring layer 133d and the bit line side diffusion layer 128d.

One of the n-type diffusion layers 128 is a source line side diffusion layer 128s. The source line side diffusion layer 128s is connected to the source line SL through a contact 130s. The source line SL is continuously provided in the Y direction.

The contact 139, the contact 130d, and the contact 130s can be formed of e.g. n-type doped polysilicon, p-type doped polysilicon, tungsten, tungsten silicide, copper (Cu), aluminum (Al), titanium (Ti), or titanium nitride (TiN).

Each of these contacts can be a conductor region made of a contact hole filled with such material.

The intermediate wiring layer 133d and the source line SL can be formed of e.g. n-type doped polysilicon, p-type doped polysilicon, tungsten, tungsten silicide, copper (Cu), aluminum (Al), titanium (Ti), or titanium nitride (TiN).

The bit lines BL are arranged in the Y direction at a prescribed spacing and extend in the X direction.

A backing wiring (second wiring) BLU is provided below the bit line BL. Contacts 139a connecting the bit line BL to the backing wiring BLU are provided at both end portions of the backing wiring BLU in the X direction.

The backing wiring BLU can be formed of e.g. n-type doped polysilicon, p-type doped polysilicon, tungsten, tungsten silicide, copper (Cu), aluminum (Al), titanium (Ti), or titanium nitride (TiN). Here, the backing wiring BLU, the intermediate wiring layer 133d, and the source line SL may be formed of the same material. Furthermore, the backing wiring BLU and the intermediate wiring layer 133d may be formed in the same layer.

The details of the backing wiring BLU are described later.

The contact 139a can be formed of e.g. n-type doped polysilicon, p-type doped polysilicon, tungsten, tungsten silicide, copper (Cu), aluminum (Al), titanium (Ti), or titanium nitride (TiN).

The contact 139a can be a conductor region made of a contact hole filled with such material.

An interlayer insulating film 168 formed of e.g. $SiO_2$ or SiN is provided between the source line SL, the bit line BL, the backing wiring BLU, and the transistor of the memory cell MC. Although not shown, wirings and the like can be provided above the bit line BL via an interlayer insulating film formed of e.g. $SiO_2$ or SiN.

Next, the backing wiring BLU is further illustrated.

Recently, with the increase of packaging density and integration level in semiconductor memory devices, the bit line BL connected to the memory cell MC is made thinner and longer. Thus, the wiring resistance tends to increase.

In this context, the wiring resistance can be reduced by backing the bit line BL with a backing wiring BLU.

However, simply backing the bit line BL with a backing wiring BLU may counteract the effect of reducing the wiring resistance.

More specifically, in the case where the wiring is thinned with the increase of packaging density and integration level in semiconductor memory devices, the thin line effect occurs. Here, the thin line effect refers to the fact that the resistivity of the wiring material sharply increases with the decrease of the width dimension of the wiring. In particular, if the width dimension of the wiring is comparable to the value of the electron mean free path, the resistivity of the wiring material tends to sharply increase. Here, the dimension at which the thin line effect occurs depends on the material of the wiring.

Thus, in the case of providing a backing wiring BLU, preferably, the width dimension along the Y direction (hereinafter referred to as wiring width dimension as appropriate) of the backing wiring BLU is large enough to avoid the thin line effect.

Here, the wiring width dimension of the bit line BL cannot be increased.

Each bit line BL is connected to the memory cell unit 4 (NAND string). Hence, to increase the wiring width dimension of the bit line BL, it occurs to increase the spacing of the memory cell units 4 (NAND strings) in the Y direction. However, this results in counteracting the shrinking of the semiconductor memory device 1. Thus, the wiring width dimension of the bit line BL cannot be increased. Hence, the bit line BL is prone to the thin line effect, and the wiring resistance of the bit line BL tends to increase.

Here, if the wiring width dimension of the backing wiring BLU is made smaller than the wiring width dimension of the bit line BL, the result is that the backing wiring BLU having a higher resistance than the bit line BL is connected in parallel. This counteracts the effect of reducing the wiring resistance.

As a result of the foregoing, the wiring width dimension of the backing wiring BLU is larger than the wiring width dimension of the bit line BL.

Furthermore, if the position of the backing wiring BLU in the Z direction is generally the same as the position of the intermediate wiring layer 133d and the source line SL in the Z direction, these can be formed and processed in the same process. Here, the backing wiring BLU and the intermediate wiring layer 133d are different in configuration, such as extending in different directions. However, because the wiring width dimension of the backing wiring BLU is larger than the wiring width dimension of the bit line BL, the backing wiring BLU can be processed under relatively rough lithography conditions.

Thus, the backing wiring BLU below the bit line BL can be provided in the same layer as the intermediate wiring layer 133d and the source line SL. Consequently, the productivity of the semiconductor memory device 1 can be improved.

As described above, as the wiring width dimension of the backing wiring BLU is made larger, the effect of reducing the wiring resistance can be enhanced. However, if the wiring width dimension of the backing wiring BLU is made larger than the pitch dimension of the bit line BL, the backing wirings BLU provided below the adjacent bit lines BL interfere with each other.

In this embodiment, in one or more memory cell blocks 10, the backing wirings BLU are arranged with a pitch dimension larger than the pitch dimension of the bit line BL. Furthermore, the position of the backing wiring BLU is varied for every one or more memory cell blocks 10. Consequently, all the bit lines BL can be provided with the backing wirings BLU.

Furthermore, the pitch dimension of the backing wiring BLU is set to an integer multiple of the pitch dimension of the bit line BL, and the backing wirings BLU are arranged in the Y direction at an equal pitch dimension. Thus, the backing wiring BLU can be regularly connected to each bit line BL. Consequently, the wiring resistance of each bit line BL can be easily equalized.

In the example illustrated in FIGS. 2 and 3, the wiring width dimension of the backing wiring BLU is approximately twice the wiring width dimension of the bit line BL. Here, in the case where the pitch dimension of the bit line BL is approximately twice the wiring width dimension of the bit line BL, if the wiring width dimension of the backing wiring BLU is set to approximately twice the wiring width dimension of the bit line BL, the adjacent backing wirings BLU may interfere with each other. That is, in the case where the wiring width dimension of the backing wiring BLU is set to approximately twice or more the wiring width dimension of the bit line BL, the pitch dimension of the backing wiring BLU is larger than the pitch dimension of the bit line BL.

Thus, as shown in FIGS. 2 and 3, in one memory cell block 10, the backing wirings BLU are arranged with a pitch dimension of twice the pitch dimension of the bit line BL. That is, in one memory cell block 10, the backing wiring BLU is provided on every other bit line BL.

Furthermore, the position of the backing wiring BLU is varied for each memory cell block 10. More specifically, for each memory cell block 10, the backing wiring BLU is provided at a position shifted by one pitch dimension of the bit line BL in the Y direction.

In the example illustrated in FIGS. 2 and 3, the position of the backing wiring BLU is varied for each memory cell block 10. However, the embodiment is not limited thereto. For instance, the position of the backing wiring BLU may be varied for every two or more memory cell blocks 10. That is, the position of the backing wiring BLU only needs to be varied for every one or more memory cell blocks 10. For instance, the backing wiring BLU can be provided at a position shifted by one pitch dimension of the bit line BL for every one or more memory cell blocks 10.

Here, as described above, there are cases where the backing wiring BLU and the source line SL are provided in the same layer. In such cases, the backing wiring BLU may be divided into pieces with the source line SL interposed therebetween.

In this case, there are cases where the contact 139a is provided near the end portion of the backing wiring BLU. Thus, preferably, the backing wiring BLU is divided at a position which does not affect, or affects only slightly, the memory cell MC by the wiring formation process for forming the contact 139a. That is, preferably, the backing wiring BLU is divided at a position avoiding the region above the memory cell MC.

For instance, as illustrated in FIG. 1, the end portion of the backing wiring BLU in the X direction can be provided above at least one of the select transistor S1 and the select transistor S2. Alternatively, the end portion of the backing wiring BLU in the X direction can be provided above the region between the select transistor S1 and the adjacent word line WL, or above the region between the select transistor S2 and the adjacent word line WL. That is, the end portion of the backing wiring BLU in the X direction can be provided at a position not overlapping the memory cell MC in plan view.

Here, both end portions of the backing wiring BLU in the X direction can be provided in one memory cell block 10.

Furthermore, the contact 139a can be provided above at least one of the select transistor S1 and the select transistor S2. Alternatively, the contact 139a can be provided above the region between the select transistor S1 and the adjacent word line WL, or above the region between the select transistor S2 and the adjacent word line WL. That is, the contact 139a can be provided at a position not overlapping the memory cell MC in plan view.

A method for manufacturing the semiconductor memory device according to the first embodiment can be based on known techniques, and hence the description thereof is omitted.

Second Embodiment

Figure 4:
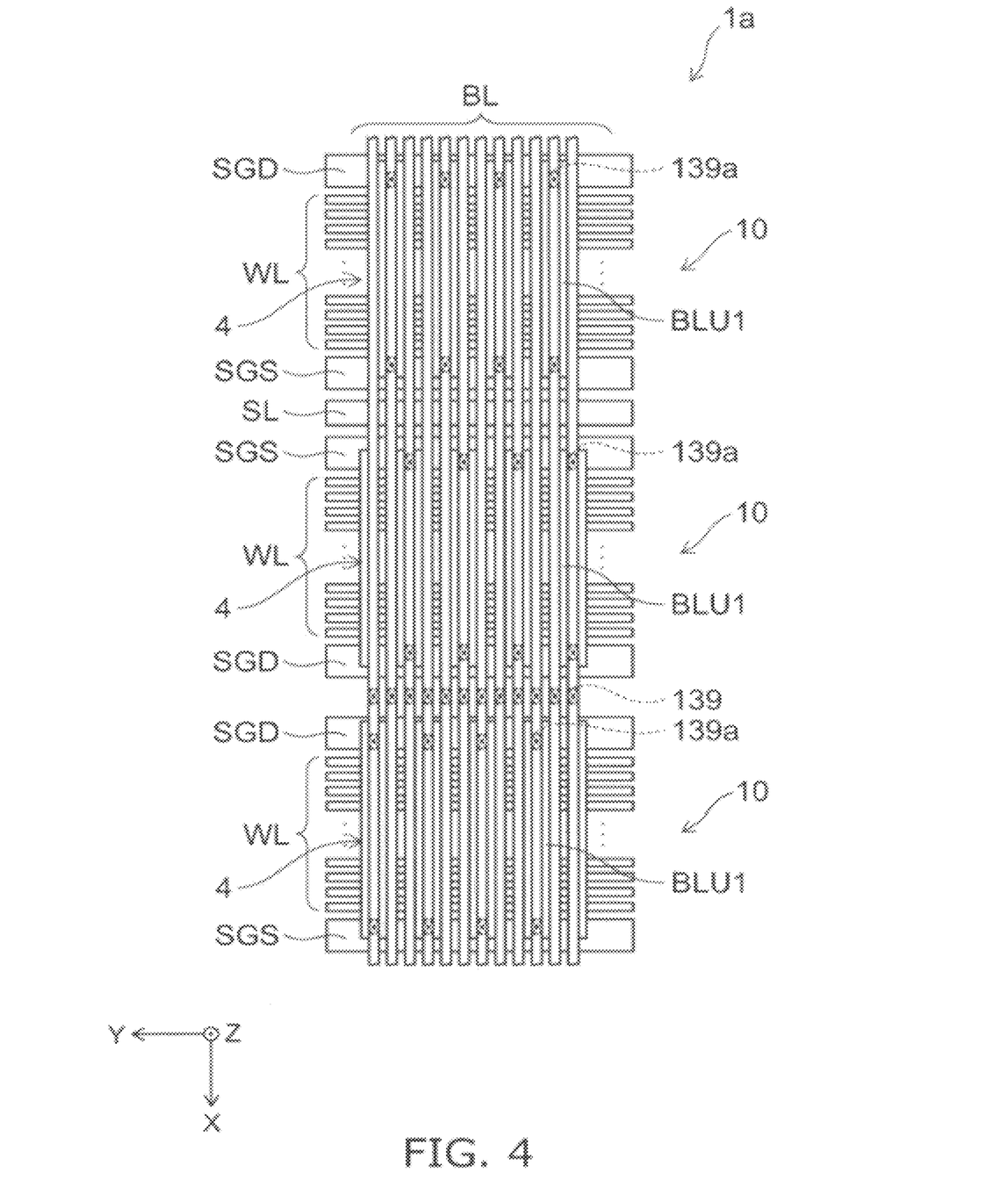
FIG. 4 is a schematic view illustrating a semiconductor memory device according to a second embodiment.
Figure 5:
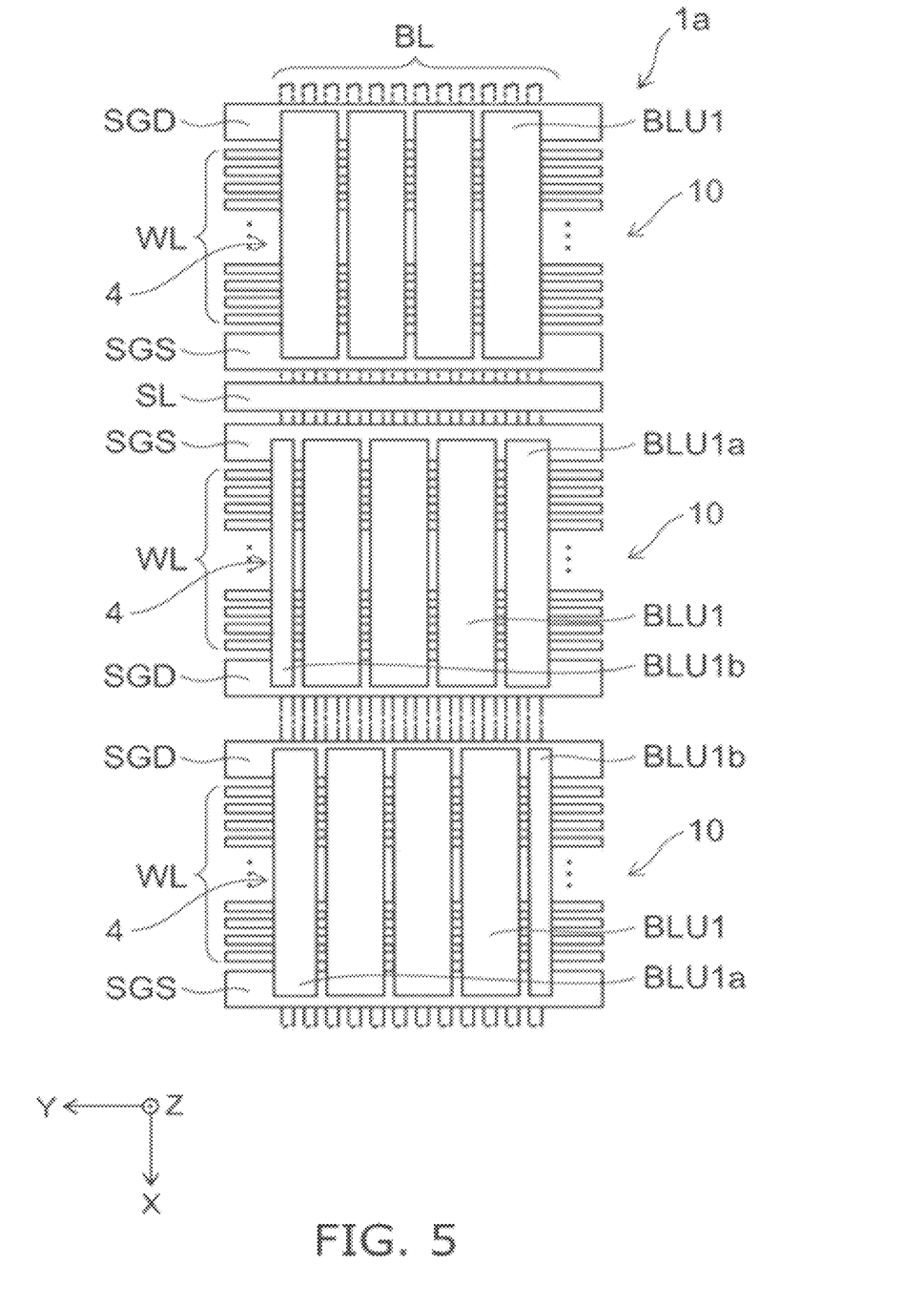
FIG. 5 is a schematic view illustrating the semiconductor memory device according to the second embodiment.

FIGS. 4 and 5 are schematic views illustrating a semiconductor memory device according to a second embodiment.

FIG. 4 corresponds to a cross-sectional view taken along line A-A' in FIG. 1. FIG. 5 corresponds to a cross-sectional view taken along line B-B' in FIG. 1.

Also in a semiconductor memory device 1a according to the second embodiment, the backing wiring BLU1, the intermediate wiring layer 133d, and the source line SL are provided in the same layer.

As shown in FIG. 5, in the semiconductor memory device 1a according to the second embodiment, the wiring width dimension of the backing wiring BLU1 is approximately five times the wiring width dimension of the bit line BL.

Hence, as compared with the semiconductor memory device 1 described above, the wiring resistance can be further reduced.

As shown in FIGS. 4 and 5, also in this embodiment, in one or more memory cell blocks 10, the backing wirings BLU1 are arranged with a pitch dimension larger than the wiring width dimension of the backing wiring BLU1. Furthermore, the position of the backing wiring BLU1 is varied for every one or more memory cell blocks 10.

More specifically, as shown in FIG. 5, in one memory cell block 10, the backing wirings BLU1 are arranged with a pitch dimension of three times the pitch dimension of the bit line BL. That is, in one memory cell block 10, the backing wiring BLU1 is connected to every third bit line BL.

Furthermore, the position of the backing wiring BLU1 is varied for each memory cell block 10. More specifically, for each memory cell block 10, the backing wiring BLU1 is provided at a position shifted by one pitch dimension of the bit line BL in the Y direction.

Thus, interference between the backing wirings BLU1 can be prevented. Furthermore, in the case where three or more blocks 10 are arranged, all the bit lines BL can be provided with the backing wirings BLU1.

This embodiment is effective in the case where although the wiring width dimension of the backing wiring BLU is approximately twice the wiring width dimension of the bit line BL, the wiring resistance of the backing wiring BLU increases due to the thin line effect.

In the example illustrated in FIGS. 4 and 5, the position of the backing wiring BLU1 is varied for each memory cell block 10. However, the embodiment is not limited thereto. For instance, the position of the backing wiring BLU1 may be varied for every two or more memory cell blocks 10. That is, the position of the backing wiring BLU1 only needs to be varied for every one or more memory cell blocks 10.

Furthermore, preferably, the wiring width dimension of the backing wiring BLU1a and the backing wiring BLU1b provided on both sides of the memory cell block 10 in the Y direction is also five times the wiring width dimension of the bit line BL. In this case, the backing wirings BLU1a and BLU1b protrude from the outermost bit line BL in the Y direction. Thus, to increase the packaging density and integration level of the semiconductor memory device in the Y direction, the wiring width dimension of the backing wiring BLU1a and the backing wiring BLU1b provided on both sides in the Y direction may be made smaller than five times the wiring width dimension of the bit line BL. Even in such cases, the wiring width dimension of the backing wiring BLU1a and the backing wiring BLU1b is larger than the wiring width dimension of the bit line BL. Hence, the effect of reducing the wiring resistance can be achieved.

As shown in FIGS. 4 and 5, also in this embodiment, there are cases where the backing wiring BLU1 and the source line SL are provided in the same layer. In such cases, the backing wiring BLU1 can be divided into pieces with the source line SL interposed therebetween.

The division of the backing wiring BLU1 is similar to the division of the backing wiring BLU described above, and hence the description thereof is omitted.

Third Embodiment

Figure 6:
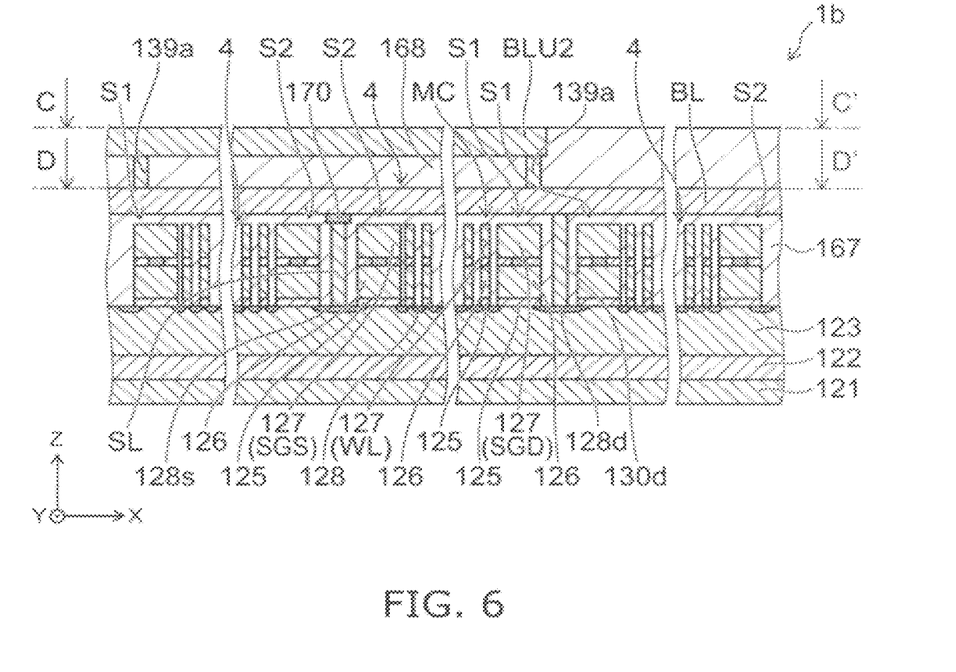
FIG. 6 is a schematic view illustrating a semiconductor memory device according to a third embodiment.

FIG. 6 is a schematic view illustrating a semiconductor memory device according to a third embodiment.

Figure 7:
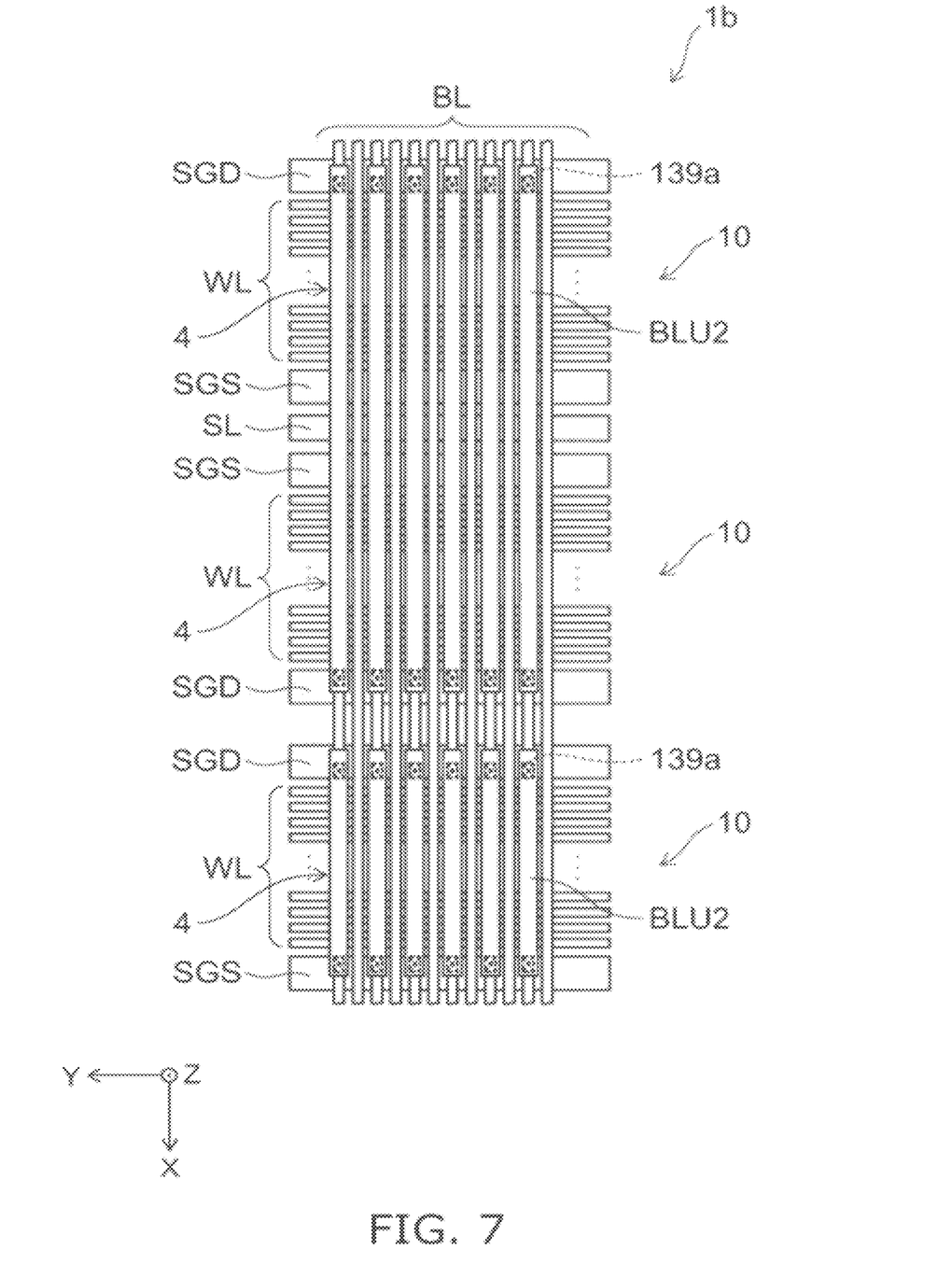
FIG. 7 is a cross-sectional view taken along line C-C' in FIG. 6.

FIG. 7 is a cross-sectional view taken along line C-C' in FIG. 6.

Figure 8:
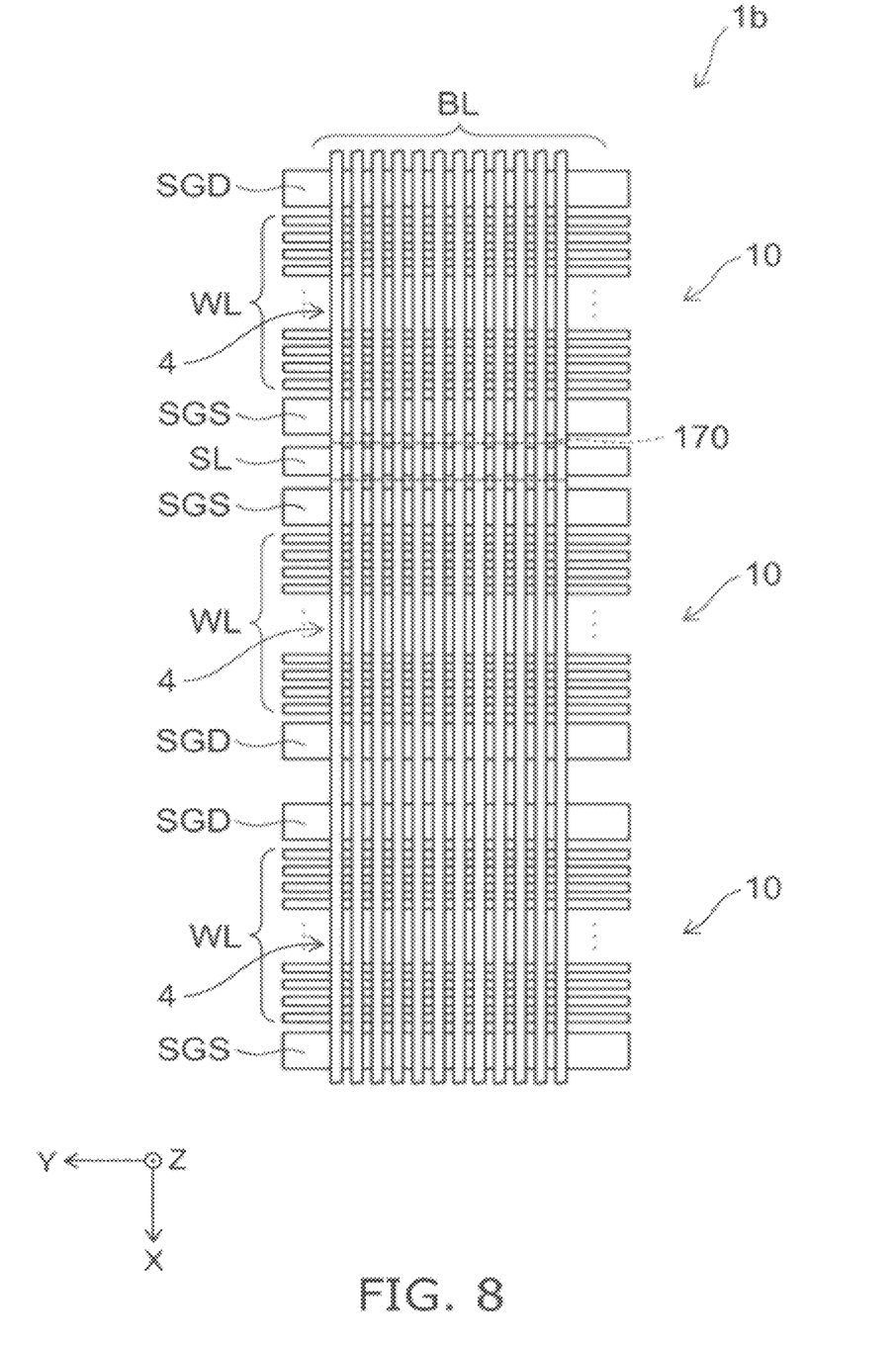
FIG. 8 is a cross-sectional view taken along line D-D' in FIG. 6.

FIG. 8 is a cross-sectional view taken along line D-D' in FIG. 6.

As shown in FIG. 6, in a semiconductor memory device 1b according to the third embodiment, the backing wiring BLU2 is provided above the bit line BL. That is, the backing wiring BLU2 is provided in the layer above the source line SL and the intermediate wiring layer 133d.

Hence, even if the source line SL is disposed, the backing wiring BLU2 is not divided. Thus, a long backing wiring BLU2 can be provided over a plurality of memory cell blocks 10. That is, the backing wiring BLU2 provided above the bit line BL can be provided across the source line SL in plan view.

Thus, the number of disposed contacts 139a can be decreased. Hence, the wiring resistance can be reduced. Furthermore, the layout design of the backing wirings BLU2 can be made more flexible.

As shown in FIG. 7, also in this embodiment, in one or more memory cell blocks 10, the backing wirings BLU2 are arranged with a pitch dimension larger than the wiring width dimension of the backing wiring BLU2. Furthermore, the position of the backing wiring BLU2 is varied for every one or more memory cell blocks 10.

More specifically, as shown in FIG. 7, in one or more than one memory cell blocks 10, the backing wirings BLU2 are arranged with a pitch dimension of approximately twice the pitch dimension of the bit line BL. That is, in one or more than one memory cell blocks 10, the backing wiring BLU2 is connected to every other bit line BL.

Furthermore, the position of the backing wiring BLU2 is varied in one or more than one memory cell blocks 10. More specifically, in one or more than one memory cell blocks 10, the backing wiring BLU2 is provided at a position shifted by one pitch dimension of the bit line BL in the Y direction.

Thus, even in the case where the wiring width dimension of the backing wiring BLU2 is larger than the wiring width dimension of the bit line BL, interference between the backing wirings BLU2 can be prevented. Furthermore, all the bit lines BL can be provided with the backing wirings BLU2.

Furthermore, as shown in FIGS. 6 and 8, an insulating layer 170 is provided between the bit line BL and the source line SL.

The insulating layer 170 can be formed from e.g. $SiO_2$ or SiN. Here, the insulating layer 170 may be either a single layer, or two or more layers. Furthermore, the insulating layer 170 may be integrated with the interlayer insulating film 168 described above. That is, the interlayer insulating film 168 may be provided also between the bit line BL and the source line SL.

Next, a method for manufacturing the semiconductor memory device according to the third embodiment illustrated in FIGS. 6 to 8 is illustrated.

Here, the process until forming the memory cells MC and the select transistors S1 and S2 can be based on known manufacturing methods, and hence the description thereof is omitted.

The memory cells MC and the select transistors S1 and S2 are covered with a first interlayer insulating film. At the position for forming source lines SL and contacts 130*d*, an opening exposing the p-type silicon region 123 is formed in the first interlayer insulating film. This opening is filled with a conductive material. The conductive material is etched back to the upper surface of the first interlayer insulating film. Thus, source lines SL and contacts 130*d* are formed.

An insulating layer 170 is formed on the upper surface of the first interlayer insulating film, the source lines SL, and the contacts 130*d*. The insulating layer 170 formed outside the region above the source line SL is removed. Here, in view of process variation, the insulating layer 170 is preferably left in a region slightly larger than the source line SL.

A second interlayer insulating film is deposited on the insulating layer 170 and the first interlayer insulating film. At the position for forming bit lines BL, a trench exposing the upper surface of the contact 130*d* is formed in the second interlayer insulating film. The trench is filled with a conductive material. The conductive material is etched back to the upper surface of the second interlayer insulating film. Thus, bit lines BL are formed. The subsequent process can be based on known manufacturing methods, and hence the description thereof is omitted.

Fourth Embodiment

Figure 9:
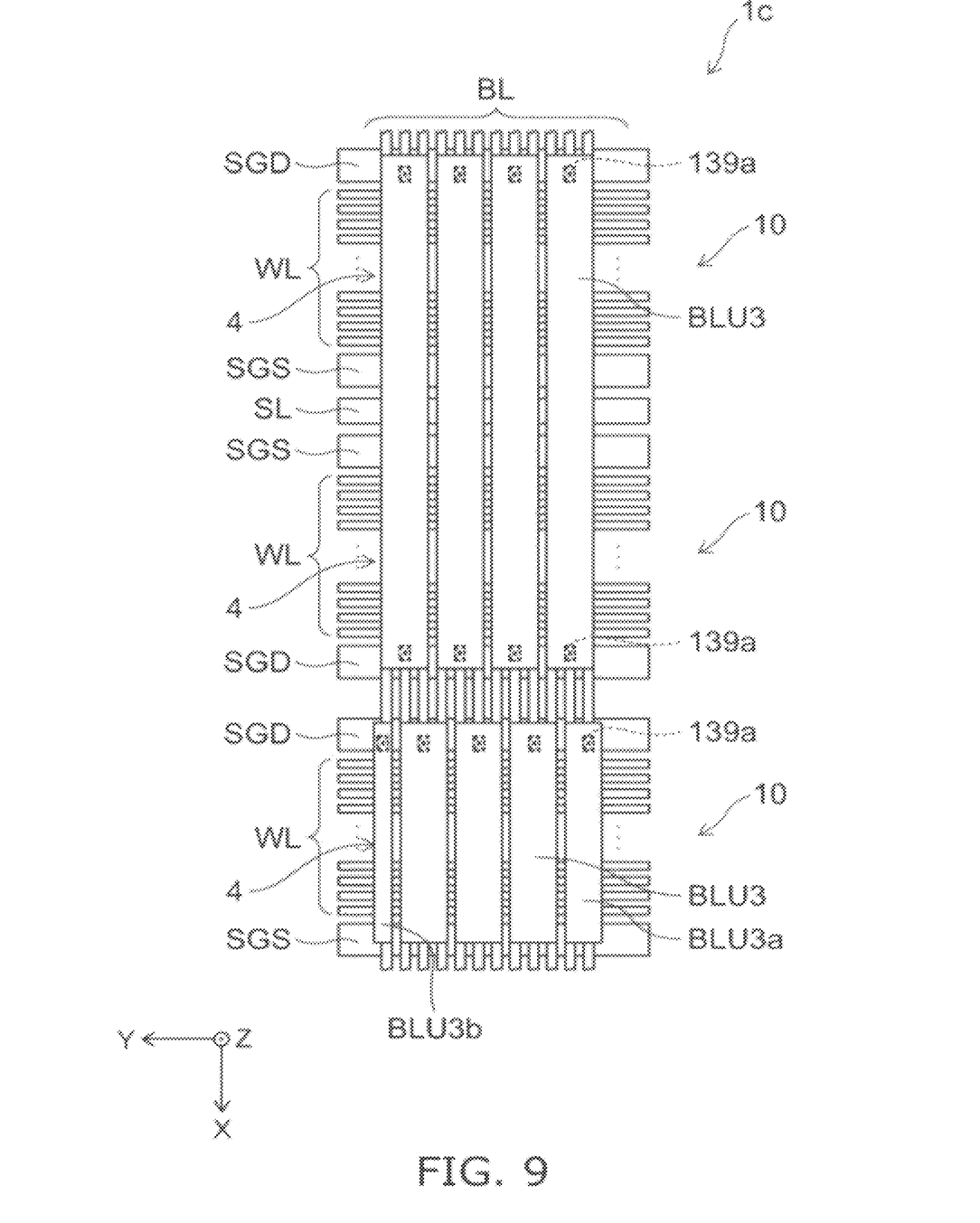
FIG. 9 is a schematic view illustrating a semiconductor memory device according to a fourth embodiment.
Figure 10:
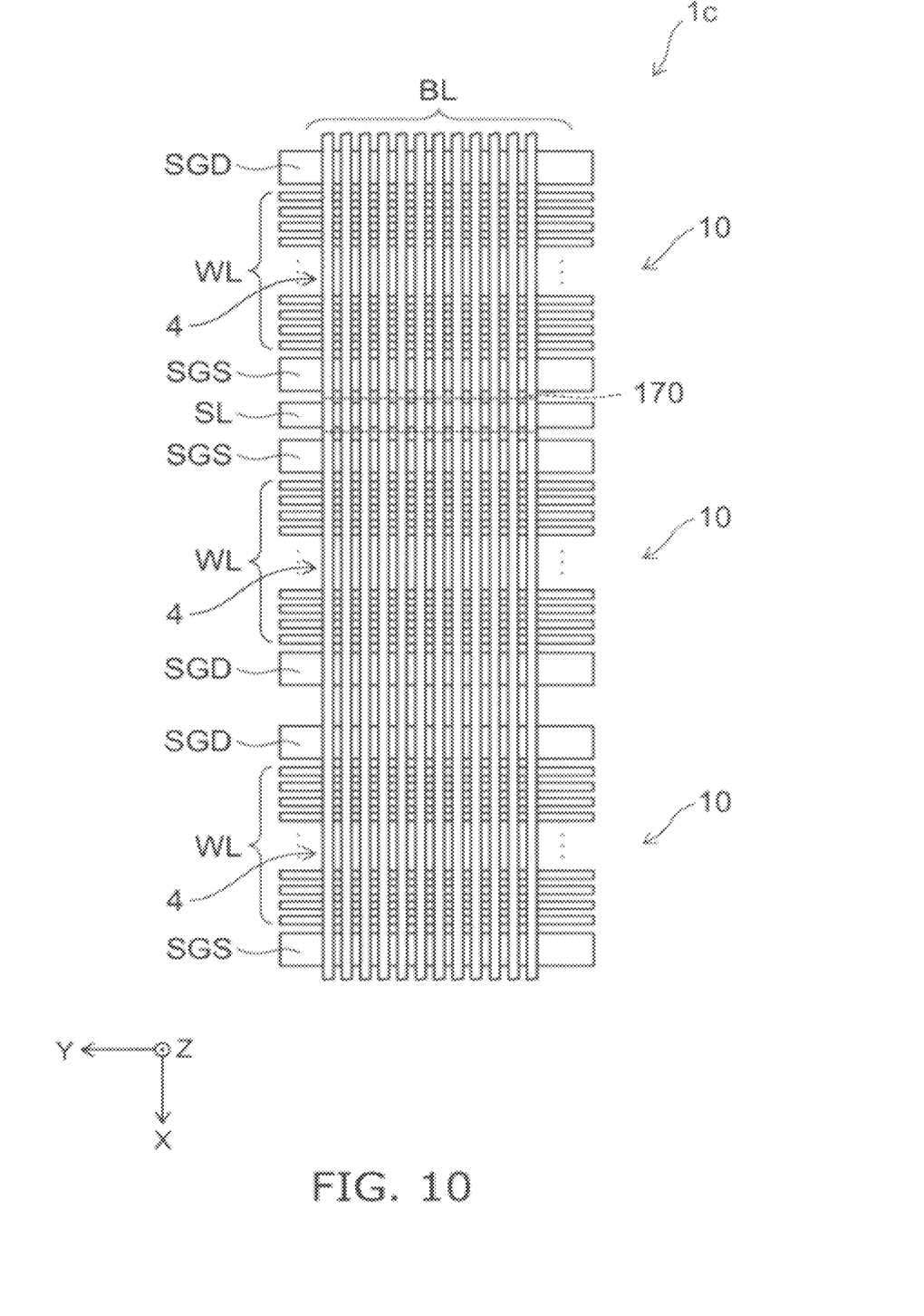
FIG. 10 is a schematic view illustrating the semiconductor memory device according to the fourth embodiment.

FIGS. 9 and 10 are schematic views illustrating a semiconductor memory device according to a fourth embodiment.

FIG. 9 corresponds to a cross-sectional view taken along line C-C' in FIG. 6. FIG. 10 corresponds to a cross-sectional view taken along line D-D' in FIG. 6.

Also in a semiconductor memory device 1*c* according to the fourth embodiment, the backing wiring BLU3 is provided above the bit line BL. That is, the backing wiring BLU3 is provided in the layer above the source line SL.

As shown in FIG. 9, the wiring width dimension of the backing wiring BLU3 is approximately five times the wiring width dimension of the bit line BL.

Hence, as compared with the semiconductor memory device 1*b* described above, the wiring resistance can be further reduced.

As shown in FIGS. 9 and 10, also in this embodiment, in one or more memory cell blocks 10, the backing wirings BLU3 are arranged with a pitch dimension larger than the wiring width dimension of the backing wiring BLU3. Furthermore, the position of the backing wiring BLU3 is varied for every one or more memory cell blocks 10.

More specifically, as shown in FIG. 9, in one or more memory cell blocks 10, the backing wirings BLU3 are arranged with a pitch dimension of three times the pitch dimension of the bit line BL. That is, in one or more memory cell blocks 10, the backing wiring BLU3 is connected to every third bit line BL.

Furthermore, the position of the backing wiring BLU3 is varied for every one or more memory cell blocks 10. More specifically, for every one or more memory cell blocks 10, the backing wiring BLU3 is provided at a position shifted by one pitch dimension of the bit line BL in the Y direction.

Thus, interference between the backing wirings BLU3 can be prevented. Furthermore, in the case where three or more blocks 10 are arranged, all the bit lines BL can be provided with the backing wirings BLU3.

This embodiment is effective in the case where although the wiring width dimension of the backing wiring BLU is approximately twice the wiring width dimension of the bit line BL, the wiring resistance of the backing wiring BLU increases due to the thin line effect.

In the example illustrated in FIGS. 9 and 10, the position of the backing wiring BLU3 is varied for every two memory cell blocks 10. However, the embodiment is not limited thereto. For instance, the position of the backing wiring BLU3 may be varied for each memory cell block 10, or for every three or more memory cell blocks 10. That is, the position of the backing wiring BLU3 only needs to be varied for every one or more memory cell blocks 10.

Furthermore, preferably, the wiring width dimension of the backing wiring BLU3*a* and the backing wiring BLU3*b* provided on both sides of the memory cell block 10 in the Y direction is also five times the wiring width dimension of the bit line BL. In this case, the backing wirings BLU3*a* and BLU3*b* protrude from the outermost bit line BL in the Y direction. Thus, to increase the packaging density and integration level of the semiconductor memory device in the Y direction, the wiring width dimension of the backing wiring BLU3*a* and the backing wiring BLU3*b* provided on both sides in the Y direction may be made smaller than five times the wiring width dimension of the bit line BL. Even in such cases, the wiring width dimension of the backing wiring BLU3*a* and the backing wiring BLU3*b* is larger than the wiring width dimension of the bit line BL. Hence, the effect of reducing the wiring resistance can be achieved.

The embodiments have been illustrated in the foregoing. However, the invention is not limited to the description of these embodiments.

Those skilled in the art can suitably modify the above embodiments. Such modifications are also encompassed within the scope of the invention as long as they fall within the spirit of the invention.

For instance, in the above examples, the wiring width dimension of the backing wiring is twice or five times the wiring width dimension of the bit line. However, the invention is not limited thereto. The wiring width dimension of the backing wiring only needs to be larger than the wiring width dimension of the bit line. Furthermore, the length of the backing wiring in the X direction, and the number of disposed backing wirings, are not limited to those illustrated, but can be suitably modified.

In the embodiments illustrated, the spacing between the backing wirings is nearly equal to the spacing between the bit lines BL. However, the spacing between the backing wirings is not limited to being equal to the spacing between the bit lines BL. Furthermore, the arrangement of the backing wirings is not limited to an evenly spaced arrangement. For instance, the backing wirings may be randomly arranged in the memory cell block 10. Other wirings may be arranged between the backing wirings in the same layer as the backing wirings.

In the foregoing, the semiconductor memory device according to the embodiments is illustrated as a NAND type EEPROM. However, the invention is not limited thereto. The semiconductor memory device may be any one of various nonvolatile semiconductor memory devices and various volatile semiconductor memory devices.

The shape, dimension, material, layout, number and the like of the components in the semiconductor memory device described above are not limited to those illustrated, but can be suitably modified.

The embodiments illustrated above can realize a semiconductor memory device capable of reducing the total wiring resistance of the bit line.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor memory device comprising:
 a plurality of memory cell blocks, each of the memory cell blocks including a plurality of memory cell units, each of the plurality of memory cell units including a plurality of memory cells and provided in a first direction at a prescribed spacing, the plurality of memory cell blocks being arranged in a second direction intersecting with the first direction;
 a plurality of first wirings extending in the second direction and provided in the first direction at a prescribed spacing;
 a plurality of second wirings provided at least one of above and below the first wiring; and
 a contact provided at both end portions of the second wiring in the second direction and connecting the first wiring to the second wiring,
 a width dimension of the second wiring along the first direction being larger than a width dimension of the first wiring along the first direction.

2. The device according to claim 1, wherein a position of the second wirings are varied for every one or more of the memory cell blocks.

3. The device according to claim 1, wherein the second wirings provided above the first wiring is provided across a plurality of the memory cell blocks.

4. The device according to claim 1, further comprising:
 a source line extending in the first direction and provided below the first wiring,
 the second wirings provided below the first wiring being provided in a same layer as the source line.

5. The device according to claim 1, wherein the contact is provided at a position not overlapping the memory cell in plan view.

6. The device according to claim 3, further comprising:
 a source line extending in the first direction and provided below the first wiring,
 the second wirings being provided across the source line in plan view.

7. The device according to claim 1, wherein a pitch dimension of the second wirings along the first direction is larger than a pitch dimension of the first wiring along the first direction.

8. The device according to claim 1, wherein the second wirings are provided at a position shifted by one pitch dimension of the first wiring for every one or more of the memory cell blocks.

9. The device according to claim 1, wherein the width dimension of the second wirings along the first direction is large enough to reduce thin line effect.

10. The device according to claim 1, wherein the both end portions of the second wirings in the second direction are provided in one of the memory cell blocks.

11. The device according to claim 4, wherein the second wirings are provided to interpose the source line between the second wirings.

12. The device according to claim 1, further comprising:
 a first select transistor provided between the first wiring and one end of the plurality of memory cells connected in series; and
 a second select transistor provided between the source line and one other end of the plurality of memory cells,
 the contact being provided above at least one of the first select transistor and the second select transistor.

13. The device according to claim 12, wherein the end portion of the second wirings in the second direction is provided above at least one of the first select transistor and the second select transistor.

14. The device according to claim 4, wherein an insulating layer is provided between the first wiring and the source line.

15. The device according to claim 4, wherein the second wirings and the source line are formed in a same process.

16. The device according to claim 4, wherein the second wirings and the source line are formed from a same material.

17. The device according to claim 1, wherein the pitch dimension of the second wirings are set to an integer multiple of the pitch dimension of the plurality of first wirings, and the second wirings are arranged in the first direction at an equal pitch dimension.

18. The device according to claim 1, wherein a width of one end of the second wirings provided in the first direction is smaller than that of an other of the second wirings.

* * * * *